United States Patent
von Malm

(10) Patent No.: US 10,505,085 B2
(45) Date of Patent: Dec. 10, 2019

(54) OPTOELECTRONIC SEMICONDUCTOR DEVICE PACKAGE WITH CONVERSION LAYER AND METHOD FOR PRODUCING THE SAME

(71) Applicant: OSRAM Opto Semiconductors GmbH, Regensburg (DE)

(72) Inventor: Norwin von Malm, Nittendorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/317,959

(22) PCT Filed: Jun. 11, 2015

(86) PCT No.: PCT/EP2015/063093
§ 371 (c)(1),
(2) Date: Dec. 11, 2016

(87) PCT Pub. No.: WO2015/189347
PCT Pub. Date: Dec. 17, 2015

(65) Prior Publication Data
US 2017/0133561 A1    May 11, 2017

(30) Foreign Application Priority Data

Jun. 12, 2014 (DE) ........................ 10 2014 108 282

(51) Int. Cl.
*H01L 33/54* (2010.01)
*H01L 33/48* (2010.01)
*H01L 33/50* (2010.01)

(52) U.S. Cl.
CPC ............ *H01L 33/54* (2013.01); *H01L 33/486* (2013.01); *H01L 33/502* (2013.01); *H01L 33/507* (2013.01)

(58) Field of Classification Search
CPC ..... H01L 33/54; H01L 33/486; H01L 33/502; H01L 33/507
(Continued)

(56) References Cited

U.S. PATENT DOCUMENTS 6,812,503 B2 * 11/2004 Lin ........................ H01L 33/483
257/100
7,893,425 B2   2/2011 Masselink et al.
(Continued)

FOREIGN PATENT DOCUMENTS

DE    2006002151 A1   1/2007
DE    102006002151 A1  1/2007
(Continued)

OTHER PUBLICATIONS

"Glass Deposition—Lithoglas Unique Hermetic Glass Thin Films," MSG Lithoglas GmbH—Our Technology, Oct. 18, 2016, 1 page.

*Primary Examiner* — Robert T Huber
(74) *Attorney, Agent, or Firm* — Slater Matsil, LLP

(57) ABSTRACT

An optoelectronic semiconductor device, a method for manufacturing an optoelectronic semiconductor device and light source having an optoelectronic semiconductor device are disclosed. In an embodiment, an optoelectronic semiconductor device includes a light-emitting diode component having at least one light-emitting diode chip and a top face, the top face arranged downstream of the light-emitting diode chip in an emission direction, wherein the light-emitting diode component further includes a molding and connection points, a conversion element arranged downstream of the light-emitting diode component in the emission direction, the conversion element includes wavelength-converting quantum dots, a frame member enclosing all side faces of the conversion element in a frame-like manner and a cover member arranged downstream of the conversion element in the emission direction, the cover member including a radia-
(Continued)

tion-transmissive material, wherein the cover member covers the conversion element at a top face remote from the light-emitting diode chip.

10 Claims, 5 Drawing Sheets

(58) Field of Classification Search
USPC .............................. 257/98, E33.061, E33.07
See application file for complete search history.

(56) References Cited

U.S. PATENT DOCUMENTS

| | | | |
|---|---|---|---|
| 7,950,857 B2 | 5/2011 | Glueck | |
| 8,330,176 B2 | 12/2012 | Thompson et al. | |
| 8,450,847 B2 | 5/2013 | Ninz et al. | |
| 8,579,451 B2 * | 11/2013 | Galvez | F21K 9/62 |
| | | | 362/84 |
| 9,085,728 B2 | 7/2015 | Uchida et al. | |
| 9,312,435 B2 | 4/2016 | Gärtner et al. | |
| 2006/0043407 A1 | 3/2006 | Okazaki | |
| 2007/0007541 A1 | 1/2007 | Kim et al. | |
| 2010/0044726 A1 | 2/2010 | Li et al. | |
| 2010/0084629 A1 | 4/2010 | Park et al. | |
| 2011/0049730 A1 | 3/2011 | Schmid et al. | |
| 2011/0169037 A1 | 7/2011 | Hasegawa et al. | |
| 2011/0309404 A1 | 12/2011 | Lee | |
| 2012/0056223 A1 | 3/2012 | Hsieh et al. | |
| 2012/0132953 A1 | 5/2012 | Becker et al. | |
| 2012/0181555 A1 * | 7/2012 | Yoo | H01L 33/486 |
| | | | 257/91 |
| 2013/0099212 A1 * | 4/2013 | Jang | C09D 183/04 |
| | | | 257/40 |
| 2013/0313604 A1 * | 11/2013 | Engl | H01L 33/44 |
| | | | 257/98 |
| 2013/0334557 A1 * | 12/2013 | Uchida | H01L 23/564 |
| | | | 257/98 |
| 2014/0117396 A1 | 5/2014 | Eisert et al. | |
| 2014/0319565 A1 * | 10/2014 | Huang | H01L 33/508 |
| | | | 257/98 |
| 2015/0014711 A1 | 1/2015 | Bergenek et al. | |
| 2015/0255688 A1 | 9/2015 | Stoll et al. | |
| 2015/0371975 A1 * | 12/2015 | Shimizu | H01L 33/486 |
| | | | 257/88 |

FOREIGN PATENT DOCUMENTS

| | | |
|---|---|---|
| DE | 102007049005 A1 | 3/2009 |
| DE | 102010055265 A1 | 6/2012 |
| DE | 102011050450 A1 | 11/2012 |
| DE | 102012101412 A1 | 7/2013 |
| DE | 102012200327 A1 | 7/2013 |
| DE | 102012110668 A1 | 5/2014 |
| EP | 1649521 B1 | 4/2006 |
| JP | 612690 A | 1/1994 |
| JP | 2003297554 A | 10/2003 |
| JP | 2004131768 A | 4/2004 |
| JP | 2004349646 A | 12/2004 |
| JP | 200593896 A | 4/2005 |
| JP | 2005158957 A | 6/2005 |
| JP | 2006066409 A | 3/2006 |
| JP | 200693672 A | 4/2006 |
| JP | 2007214592 A | 8/2007 |
| JP | 2007273498 A | 10/2007 |
| JP | 200856967 A | 3/2008 |
| JP | 2010518646 A | 5/2010 |
| JP | 2010177375 A | 8/2010 |
| JP | 2011077182 A | 4/2011 |
| JP | 2011108889 A | 6/2011 |
| JP | 2011249729 A | 12/2011 |
| JP | 201215466 A | 1/2012 |
| JP | 201223407 A | 2/2012 |
| JP | 212039121 A | 2/2012 |
| JP | 2012515441 A | 7/2012 |
| JP | 201380820 A | 5/2013 |
| WO | 2012102107 A1 | 8/2012 |
| WO | 2012132236 A1 | 10/2012 |
| WO | WO 2012140050 A2 * | 10/2012 ............ H01L 33/44 |
| WO | 2015154958 A1 | 10/2015 |

* cited by examiner

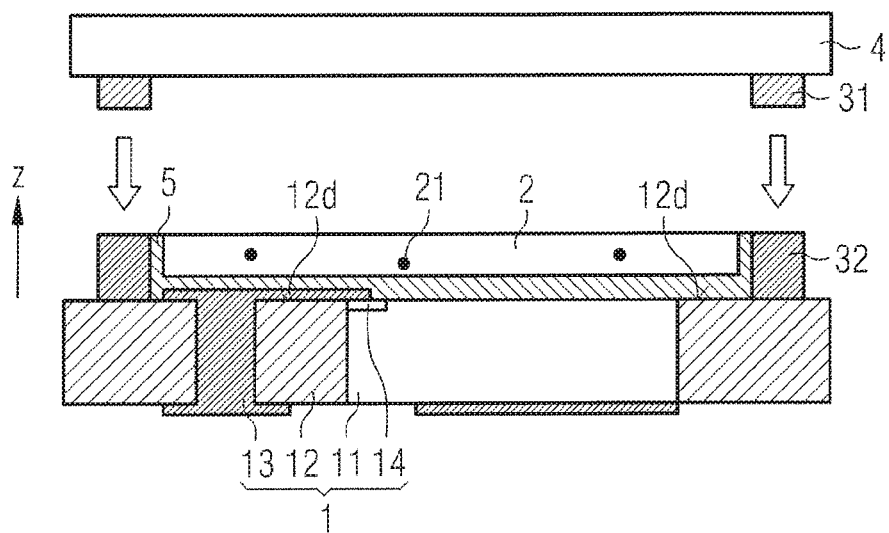
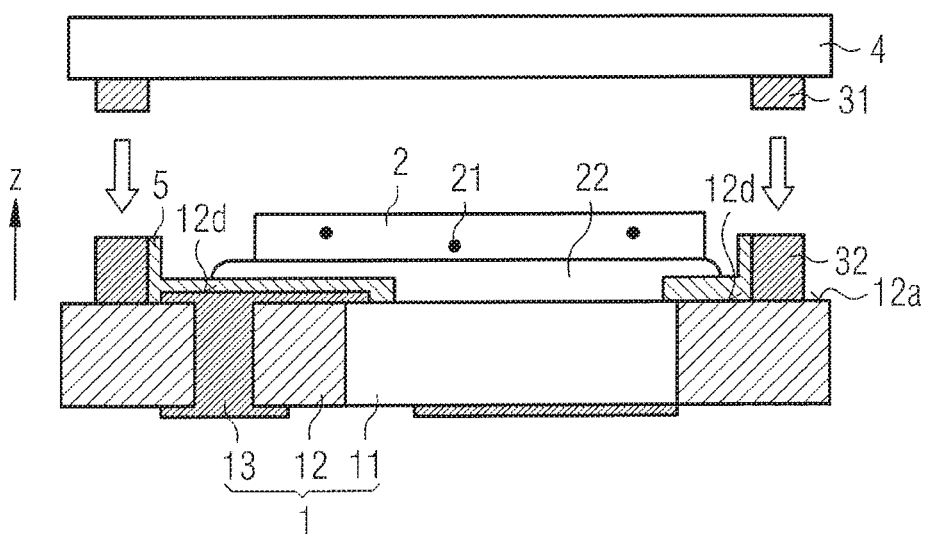

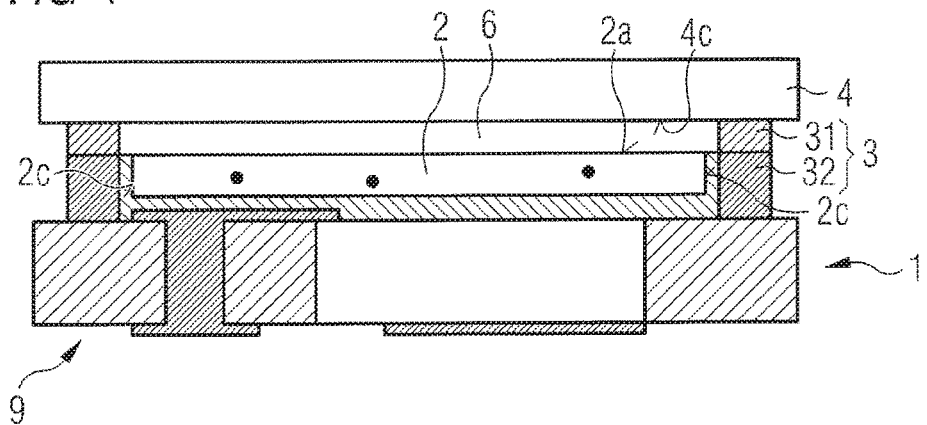
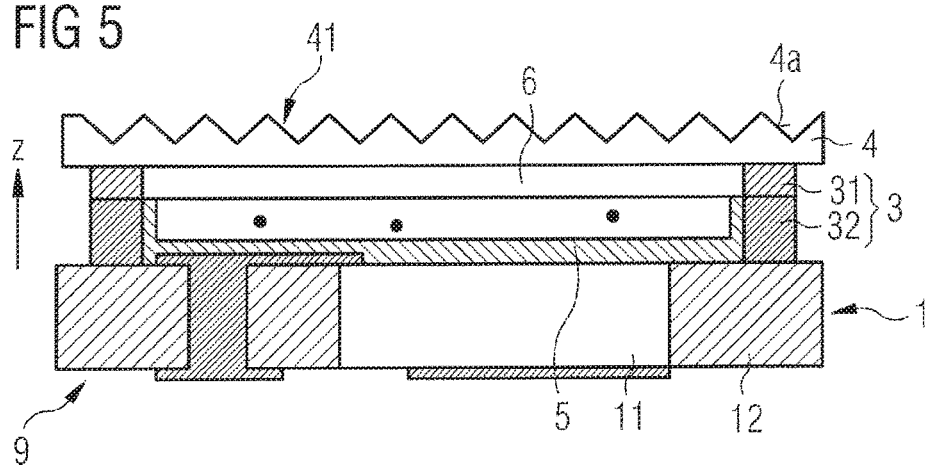
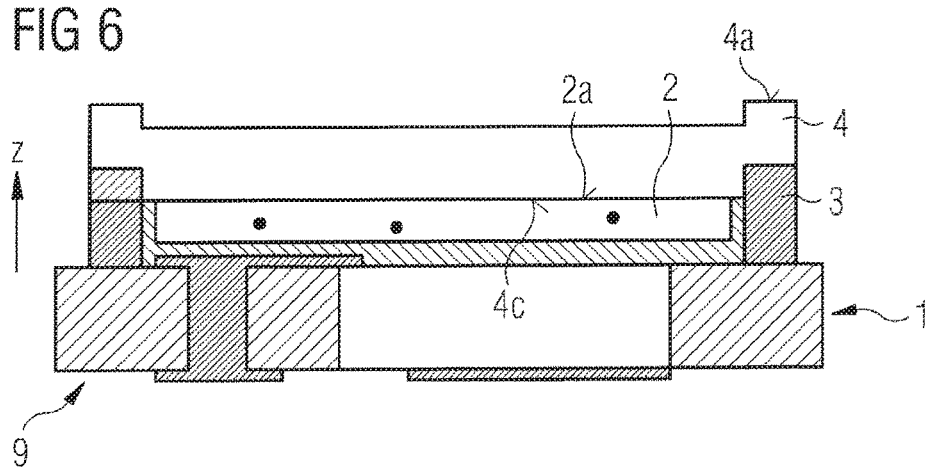

OPTOELECTRONIC SEMICONDUCTOR DEVICE PACKAGE WITH CONVERSION LAYER AND METHOD FOR PRODUCING THE SAME

This patent application is a national phase filing under section 371 of PCT/EP2015/063093, filed Jun. 11, 2015, which claims the priority of German patent application 10 2014 108 282.6, filed Jun. 12, 2014, each of which is incorporated herein by reference in its entirety.

BACKGROUND

Document DE 10 2012 110 668 describes an optoelectronic semiconductor device and a method for producing such an optoelectronic semiconductor device.

One problem addressed consists in providing an optoelectronic semiconductor device with a sensitive converter material and a light source with such an optoelectronic semiconductor device, each of which have an elevated service life. A further problem addressed consists in providing a method for producing an optoelectronic semiconductor device with a sensitive converter material.

SUMMARY OF THE INVENTION

Embodiments of the invention provide an optoelectronic semiconductor device. The optoelectronic semiconductor device, for example, comprises a light-emitting semiconductor diode, which is provided to emit electromagnetic radiation. Alternatively, the optoelectronic semiconductor device may also comprise a light-detecting semiconductor diode, which is provided for detecting electromagnetic radiation.

According to at least one embodiment of the optoelectronic semiconductor device, the latter comprises a light-emitting diode component. The light-emitting diode component may, for example, be an inorganic light-emitting diode component. The light-emitting diode component comprises at least one light-emitting diode chip and a top face, which is arranged downstream of the light-emitting diode chip in a direction of emission. In particular, the light-emitting diode chip may be an inorganic light-emitting diode chip. In other words, a semiconductor body of the light-emitting diode chip may be formed with inorganic compounds or, within the bounds of manufacturing tolerances, consist of inorganic compounds.

The light-emitting diode component comprises a main plane of extension, in which it extends in lateral directions. Perpendicular to the main plane of extension and parallel to the direction of emission, the light-emitting diode component has a thickness. The thickness of the light-emitting diode component is small relative to the maximum extent of the light-emitting diode component in a lateral direction.

According to at least one embodiment of the optoelectronic semiconductor device, the latter comprises a conversion element, which is arranged downstream of the light-emitting diode component in the emission direction. The conversion element in particular comprises a sensitive wavelength-converting converter material. A sensitive converter material is distinguished, for example, in that the converter material can be destroyed and/or damaged, for example, by oxidation on contact with, for example, oxygen and/or water. Furthermore, the sensitive converter material may react sensitively to temperature fluctuations and be impaired, for example, in its functionality by such temperature fluctuations. The sensitive converter material may in the present case be wavelength-converting quantum dots and/or an organic converter material.

Furthermore, a wavelength-converting converter material is distinguished in that the wavelength of electromagnetic radiation emitted by the light-emitting diode component or by the light-emitting diode chip is converted at the converter material. In this case, the wavelength is preferably increased. For example, blue electromagnetic radiation is converted by the conversion element at least partially or completely into red and/or green radiation.

It is in particular possible for the conversion element not to comprise an active zone for radiation generation through conversion of electrical energy into photons. In other words, it is possible for the conversion element to be a passive element, which merely converts the electromagnetic radiation emitted by the light-emitting diode chip.

According to at least one embodiment of the optoelectronic semiconductor device, the latter comprises a cover member, which is formed from a radiation-transmissive material. "Radiation-transmissive" may here and hereinafter mean that at least 90%, in particular 90%, preferably at least 95% of the electromagnetic radiation emitted and/or detected by the light-emitting diode component and/or converted by the converter material is transmitted through the material of the cover member. In particular, "radiation-transmissive" may mean that the material of the cover member has a transmission coefficient for the electromagnetic radiation emitted and/or detected by the light-emitting diode component and/or converted by the converter material of at least 90%, preferably at least 95%.

The cover member may, for example, be formed with a glass. The cover member may be a glass sheet. A glass sheet here comprises a one-piece body formed with glass. The glass sheet has a main plane of extension and a thickness extending vertically relative to this main plane of extension which is small compared with the extent of the glass sheet in the main plane of extension. The cover member is arranged downstream of the conversion element in the emission direction. The electromagnetic radiation converted by the conversion element and previously emitted by the light-emitting diode component may thus pass through the cover member and be outcoupled into a material surrounding the semiconductor device, such as, for example, ambient air.

According to at least one embodiment of the optoelectronic semiconductor device, the latter comprises a frame member. The frame member comprises a metallic material, for example. The frame member may in particular be of reflective construction. "Reflective" may here and hereinafter mean that at least 90%, preferably at least 95% of the electromagnetic radiation emitted and/or detected by the light-emitting diode component and/or converted by the converter material is reflected by a material of the frame member. In particular, "reflective" and/or "radiation-reflective" may here and hereinafter mean that the frame member has a reflection coefficient of at least 90%, preferably at least 95% for the electromagnetic radiation emitted and/or detected by the light-emitting diode component and/or converted by the converter material. Advantageously, the frame member has high thermal conductivity. For instance, an elevated temperature of the light-emitting diode component, in particular of the converter material, may, for example, be dissipated via the frame member, so protecting the conversion element from heating up.

According to at least one embodiment of the optoelectronic semiconductor device, the frame member encloses all the side faces of the conversion element in the manner of a frame. In a plan view from the emission direction, i.e. in a plan view from above, the frame member thus delimits the conversion element laterally at the side faces thereof. "In the manner of a frame" does not however mean that the conversion element and/or outer faces and/or inner faces, facing the conversion element, of the frame member have to have a rectangular shape when viewed in plan view. Rather, the conversion element and/or the outer face and/or the inner faces of the frame member may have a polygonal, triangular, oval or round shape when viewed in plan view. Preferably, the frame member completely surrounds all the side faces of the conversion element. In this case, the frame member may directly adjoin the conversion element. It is alternatively possible for a cavity, such as, for example, a gap, which may be filled with a gas, to be located between the frame member and the conversion element. At least one top face of the frame member is contiguous when viewed in plan view from above.

According to at least one embodiment of the optoelectronic semiconductor device, the cover member covers the conversion element at the top face thereof remote from the light-emitting diode component. The cover member may furthermore cover the frame member at least in places at the top face thereof remote from the light-emitting diode component. Preferably, the cover member completely covers the conversion element and the frame member. In a plan view from the emission direction onto the optoelectronic semiconductor device, no exposed area of the conversion element and/or of the frame member is thus visible.

According to at least one embodiment of the optoelectronic semiconductor device, the latter comprises a light-emitting diode component with at least one light-emitting diode chip and a top face, which is arranged downstream of the light-emitting diode chip in an emission direction, a conversion element, which is arranged downstream of the light-emitting diode component in the emission direction, a frame member and a cover member, which is formed from a radiation-transmissive material. The frame member encloses all the side faces of the conversion element in the manner of a frame. The cover member is arranged downstream of the conversion element in the emission direction and covers the conversion element on its top face remote from the light-emitting diode component.

According to at least one embodiment of the optoelectronic semiconductor device, the latter further comprises a barrier layer. The barrier layer is arranged between the light-emitting diode component and the conversion element. The barrier layer may in particular be in direct contact with the light-emitting diode component and/or the conversion element. In particular, the barrier layer may directly adjoin the bottom face of the conversion element. Furthermore, it is possible for the barrier layer to directly adjoin the side faces of the conversion element. The barrier layer completely covers all the outer faces of the light-emitting diode component facing the conversion element. The outer faces of the light-emitting diode component facing the conversion element are here the outer faces which would be in direct contact with the conversion element in the event of no layer being arranged between the conversion element and the light-emitting diode component, i.e. in the event of the conversion element being in direct contact with the light-emitting diode component. It is, for example, additionally possible for the outer faces, facing the light-emitting diode component, of the conversion element to be completely covered by the barrier layer. The barrier layer may furthermore cover lateral side faces of the conversion element at least in part. The conversion element is free of the barrier layer only at the outer faces thereof remote from the light-emitting diode component. The barrier layer seals the conversion element at the outer faces thereof facing the light-emitting diode component.

In particular, the barrier layer may at least partly cover all the inner faces of the optoelectronic semiconductor device. For example, the barrier layer covers 90%, preferably 95%, of the inner faces of the optoelectronic semiconductor device. The inner faces of the optoelectronic semiconductor device here consist of the outer faces, facing the conversion element, of the light-emitting diode component and all the side faces, facing the conversion element, of the frame member.

According to at least one embodiment of the optoelectronic semiconductor device, the conversion element comprises wavelength-converting quantum dots as sensitive wavelength-converting converter material. The conversion element is formed, for example, with a matrix material, wherein the wavelength-converting quantum dots have been introduced into the matrix material. The conversion element may thus be a potting body containing the quantum dots. The potting body is preferably formed of a material which, for example, by means of casting, is processed into the final product in liquid form and solidified as said final product. Production by casting may lead to good filling and/or sealing of any cavities present and/or to form-fitting overmolding of cast materials. For example, the matrix material may be formed with silicone, acrylate, epoxy resin, polycarbonate or a sol-gel material.

Through the use of quantum dots as the converter material, good color rendering may be achieved, since the converted electromagnetic radiation is relatively narrow-band and thus no mixing of different spectral colors arises. For example, the spectrum of the converted radiation has a wavelength width of at least 20 nm to at most 35 nm. This allows the generation of light whose color may be assigned very precisely to a region of the spectrum. In this way, when the optoelectronic semiconductor device is used in a display, a large color gamut may be achieved, since, for example, a narrow-band green- and a narrow-band red-converting converter may be used instead of a broadband yellow-converting converter, so enabling greater color coverage.

The quantum dots are preferably nanoparticles, i.e. particles with a size in the nanometer range. The quantum dots comprise a semiconductor core, which has wavelength-converting characteristics. The semiconductor core may, for example, be formed with CdSe, CdS, InAs and/or InP. The semiconductor core may be encased in a plurality of layers. In other words, the semiconductor core may be completely or almost completely covered by further layers at its outer faces.

A first encasing layer of a quantum dot is, for example, formed with an inorganic material, such as, for example, ZnS, CdS and/or CdSe, and serves in creation of the quantum dot potential. The first encasing layer and the semiconductor core are almost completely enclosed at the exposed outer faces by at least one second encasing layer. The second layer may, for example, be formed with an organic material, such as, for example, cystamine or cysteine, and may serve to improve the solubility of the quantum dots in, for example, a matrix material and/or a solvent. In this case, it is possible for a spatially uniform distribution of the quantum dots in a matrix material to be improved as a result of the second encasing layer.

This results in the problem that the second encasing layer of the quantum dot could oxidize on contact with air and thereby be destroyed, so reducing the solubility of the quantum dots. This would then, for example, result in agglomeration of the quantum dots, i.e. lump formation, in the matrix material. In the case of lump formation, the quantum dots would draw too close to one another in the matrix material and the excitation energies might be exchanged in a radiationless manner between the quantum dots. This would result in efficiency loss during wavelength conversion.

Destruction of the second encasing layer may be prevented by hermetic sealing of the quantum dots from the air surrounding the semiconductor device. This hermetic sealing here proceeds via sealing by means of the frame member, the cover member and/or the barrier layer. This allows the use of a conversion element with a sensitive converter material for an optoelectronic semiconductor device.

As an alternative or in addition to quantum dots as converter material, the wavelength conversion element may contain an organic converter material. The organic converter material, for example, comprises organic dyes. Examples of suitable organic dyes are those which are based on or contain or consist of one or more of the following substances: acridine dyes, acridinone dyes, anthraquinone dyes, anthracene dyes, cyanine dyes, dansyl, squaryllium dyes, spiropyrans, boron dipyrromethanes (BODIPY), perylenes, pyrenes, naphthalenes, flavines, pyrroles, porphyrins and the metal complexes thereof, diarylmethane dyes, triarylmethane dyes, nitro dyes, nitroso dyes, phthalocyanine dyes, metal complexes of phthalocyanines, quinones, azo dyes, indophenol dyes, oxazines, oxazones, thiazines, thiazoles, fluorenes, flurones, pyronines, rhodamines, coumarines. Such organic dyes are, for example, also known from German published specification DE 10 2007 049 005 A1, the disclosure content of which is hereby included by reference.

According to at least one embodiment of the optoelectronic semiconductor device, the cover member and the frame member are joined together mechanically. In particular, the cover member and the frame member completely cover all the outer faces remote from the light-emitting diode component including the laterally located side faces of the conversion element. In other words, at the outer faces remote from the light-emitting diode component the conversion element is completely enclosed by the cover member and the frame member.

According to at least one embodiment of the optoelectronic semiconductor device, the light-emitting diode component comprises a molding. The molding may be in direct contact with the light-emitting diode component. The molding may, for example, be formed with a silicone and/or an epoxy resin.

In particular, the molding may be configured to provide mechanical stabilization. In other words, mechanical handling of the light-emitting diode component is improved by the molding, whereby, for example, a higher external force may act on the optoelectronic semiconductor device without the latter being destroyed. In particular, the light-emitting diode component may become mechanically self-supporting as a result of the molding, i.e. the light-emitting diode component may for instance be handled with tools such as, for example, tweezers during the manufacturing process without the presence of a further supporting element being required. Use of the molding thus makes it possible to dispense with a further mechanically stabilizing carrier or a further package. In this way, the light-emitting diode component may be of particularly compact and/or planar construction.

According to at least one embodiment of the optoelectronic semiconductor device, the light-emitting diode component further comprises connection points. The connection points may in particular be of electrically conductive construction and pass through the molding at least in places. In particular, the connection points may be connected electrically conductively with the light-emitting diode chip. The connection points are freely accessible from outside at least at one outer face of the light-emitting diode component.

For example, the molding covers all laterally located side faces of the light-emitting diode component and the connection points are freely accessible at a bottom face, remote from the conversion element, of the light-emitting diode component and may be directly contacted there. The light-emitting diode component is then a "top-looker". Alternatively, it is possible for the molding to cover the side faces of the light-emitting diode component only in places and additionally to cover the bottom face, remote from the top face of the light-emitting diode component, of the light-emitting diode chip and of the connection points at least in places. Contacting by means of the connection points then proceeds at one of the side faces of the light-emitting diode component. The light-emitting diode component is then a "side-looker".

It is furthermore possible for at least one further electronic component, such as, for example, an electronic sensor, a driver or in general a further electronic (semiconductor) component, to be introduced into the molding. Mechanical connection of the further electronic component with the other components of the light-emitting diode component, i.e. the at least one light-emitting diode chip and the connection points, is then produced by way of the molding. In addition, the light-emitting diode component may comprise at least one second light-emitting diode chip.

According to at least one embodiment of the optoelectronic semiconductor device, the conversion element is hermetically sealed, within the bounds of manufacturing tolerances, by the barrier layer and/or the connection points, the frame member and the cover member. The arrangement of the conversion material between the barrier layer and/or the connection points and the cover member, which is hermetically sealed through being joined to the frame member, guarantees a long service life for the optoelectronic semiconductor device. "Within the bounds of manufacturing tolerances" should here be understood to mean that the hermetic seal is as good as possible. In other words, the materials of the barrier layer and/or of the connection points, of the frame member and of the cover member are selected such that they have as low as possible a water vapor transmission rate and, in the case of connection or application respectively of the barrier layer and the connection points, the frame member and the cover member, hole formation in the respective components is avoided.

According to at least one embodiment of the optoelectronic semiconductor device, the material of the barrier layer, the material of the frame member and/or the material of the cover member have a water vapor transmission rate (WVTR) which amounts to at most $1\times10^{-3}$ g/m$^2$/day, preferably at most $3\times10^{-4}$ g/m$^2$/day. The barrier layer, the frame member and/or the cover member are thus hermetically sealing components. For example, the cover member is formed to this end with a glass. For hermetic sealing, the barrier layer, for example, comprises a multiplicity of layers, wherein organic and inorganic layers may alternate in the emission direction. The materials are in particular highly impermeable with regard to the penetration and/or transmission of air and/or water vapor. This may be achieved with materials described here and barrier layers described here.

According to at least one embodiment of the optoelectronic semiconductor device, the material of the molding has a higher water vapor transmission rate than the material of the barrier layer, the material of the frame member and/or the material of the cover member. In the regions of the molding, oxygen, air and/or water vapor may thus diffuse from outside through the molding, so possibly leading to oxidation of the outer layer of the quantum dots in the conversion element. To prevent this oxidation due to oxygen entering through the molding, the barrier layer is provided on the light-emitting diode component. Alternatively or in addition, a further hermetically sealing layer may be present on the molding.

According to at least one embodiment, the barrier layer comprises at least one first layer and at least one second layer in the emission direction. The first and second layers may directly adjoin one another. The first and second layers are formed from different materials. The first layer preferably contains an organic material and the second layer an inorganic material or vice versa. For example, the barrier layer comprises a multiplicity of layers, wherein organic and inorganic layers may alternate in the emission direction. Examples of suitable materials for the layers are $Al_2O_3$, $SiO_2$, $ZrO_2$, $TiO_2$, $Si_3N_4$ and/or $SiO_xN_y$. For example, the first layer may be formed with $TiO_2$ and the second with $Al_2O_3$.

Furthermore, the barrier layer preferably has a high modulus of elasticity and a high coefficient of thermal expansion. For example, the coefficient of thermal expansion of the barrier layer differs by at most 20%, preferably at most 10%, from the coefficient of thermal expansion of the material of the molding.

According to at least one embodiment of the optoelectronic semiconductor device, within the bounds of manufacturing tolerances the connection points cover all the outer faces of the molding facing the conversion element. The connection points are thus of large-area configuration and drawn over the outer faces, facing the conversion element, of the molding. "Within the bounds of manufacturing tolerances" means in this context that the outer faces, facing the conversion element, of the molding may in places remain free of the connection points, if a short circuit would, for example, otherwise occur. For example, the connection points cover 90%, preferably 95%, of the outer faces, facing the conversion element, of the molding. This large-area embodiment of the connection points may be in addition or an alternative to the barrier layer. It is in this case possible to seal the conversion element hermetically by means of this large-area embodiment of the connection points.

According to at least one embodiment of the optoelectronic semiconductor device, the frame member comprises a reactive heating layer and a first metal frame. The reactive heating layer is formed with a reactive material. The reactive heating layer is formed from a plurality of layers, wherein the layers are formed with at least two different metals and/or semiconductor materials. The layers contain palladium, aluminum, nickel, titanium and/or silicon, for example. Two adjoining layers may in this case, for example, contain the following combination of the above materials: Pd/Al, Ni/Al, Ti/Si. The materials of the reactive heating layer are in this case preferably selected such that they react exothermically together in the event of electrical ignition, so resulting in local melting of the reactive heating layer at the regions of the reacting materials.

In particular, the reactive heating layer may take the form of a grid. In other words, the reacting materials of the heating layer may be configured in the form of a grid. The reactive heating layer in this case assumes the function of a bonding material. In particular, it is thereby intended to avoid the use of a non-hermetically sealing adhesive.

According to at least one embodiment of the optoelectronic semiconductor device, the first metal frame is formed with a metal. The reactive heating layer and the metal of the first metal frame are in this case fused together by means of an exothermic chemical reaction of the reactive material. For example, the reactive heating layer to this end additionally contains a solder layer which was melted by means of an exothermic chemical reaction. The solder layer may, for example, be formed with one of the following material combinations: Au/Sn, Ni/Sn, Cu/Sn/Ag and Au/In.

A method for producing an optoelectronic semiconductor device is additionally provided. The optoelectronic semiconductor device may preferably be produced by means of this method. In other words, all the features disclosed for the method are also disclosed for the optoelectronic semiconductor device and vice versa.

According to at least one embodiment of the method for producing an optoelectronic semiconductor device, first of all a light-emitting diode component is provided which comprises at least one light-emitting diode chip and one top face, which is arranged downstream of the light-emitting diode chip in an emission direction.

A first metal frame comprising a radiation-reflecting metal is applied to the top face of the light-emitting diode component. As an alternative to a metal, it is also possible to use another radiation-reflecting and hermetically sealing material. A radiation-reflecting metal may in particular be a reflective metal. The first metal frame is of contiguous and frame-shaped configuration when viewed in plan view from the emission direction. For example, the shape of the first metal frame is defined with a lithography method. It is additionally possible for direct laser exposure and/or an electrodeposition method to be used to produce the first metal frame. In addition, the first metal frame may be applied to the top face using physical vapor deposition (PVD), chemical vapor deposition (CVD) or atomic layer deposition (ALD).

According to at least one embodiment of the method, a conversion element is applied on the side, comprising the first metal frame, of the light-emitting diode component. Application of the conversion element proceeds, for example, by casting or compression molding. In this case it is possible but not essential for the first metal frame to serve as a delimiting mold for the potting material of the conversion element. The conversion element may, for example, also be applied by gluing on of a prefabricated conversion element. In other words, the conversion element is firstly produced in another process and then applied to the light-emitting diode component or to the cover member. Gluing on may proceed, for example, with a silicone and/or a resin.

According to at least one embodiment of the method, a radiation-transmissive cover member is mounted on a side, comprising the first metal frame, of the light-emitting diode component. The cover member is, for example, a glass sheet and application proceeds by laying the cover member in place. The cover member is then preferably bonded to the first metal frame by means of a bonding material, such as, for example, a reactive heating layer. It is moreover possible for the cover member to be applied to the side, comprising the metal frame, of the light-emitting diode component by means of a deposition method.

According to at least one embodiment, a method for producing an optoelectronic semiconductor device comprises the following steps:

providing a light-emitting diode component having at least one light-emitting diode chip and a top face, which is arranged downstream of the light-emitting diode chip in an emission direction, applying a first metal frame to the top face of the light-emitting diode component, wherein the first metal frame is contiguous and frame-shaped when viewed in plan view from the emission direction, applying a conversion element to a side of the light-emitting diode component comprising the first metal frame, applying a radiation-transmissive cover member to a side, comprising the first metal frame, of the light-emitting diode component.

The method steps are preferably carried out in the stated order.

According to at least one embodiment of the method, prior to application of the conversion element a barrier layer is applied to the top face of the light-emitting diode component. Application of the barrier layer may proceed, for example, by atomic layer deposition (ALD) and/or chemical vapor deposition (CVD).

The barrier layer is preferably built up from multiple layers. The barrier layer may thus be a multilayer stack. In this case, at least one of the layers of the barrier layer may be applied by an ALD method and at least one of the layers of the barrier layer by a CVD method. $Al_2O_3$, $SiO_2$, $ZrO_2$, $TiO_2$, $Si_3N_4$ and/or $SiO_xN_y$ may, for example, be used as the materials for the layers. The use of a parylene is also possible.

The barrier layer comprises at least one first layer and at least one second layer, wherein the first layer and the second layer are formed from different materials and/or different chemical compositions.

According to at least one embodiment of the method, the first and second layers are produced using different deposition methods. For example, the first layer is produced using a CVD method, while the second layer is formed using an ALD method or vice versa. It is additionally possible for the barrier layer to contain a multiplicity of layers, wherein layers which have been produced using a CVD method and layers which have been produced using an ALD method may alternate. For example, organic layers are produced using a CVD method and inorganic layers using an ALD method or vice versa. Preferably, layers which are produced using different deposition methods adjoin one another directly.

On application of the barrier layer, it may be possible for the barrier layer to cover an upper side, remote from the light-emitting diode component, of the first metal frame. Using a material-removing process, such as, for example, grinding or polishing, the barrier layer may be removed from the upper side of the first metal frame, in order to ensure a solderable metal surface.

According to at least one embodiment of the method, for application of the cover member first of all said cover member is provided. A reactive heating layer, which is formed using a reactive material, is then applied to a bottom face, facing the light-emitting diode component, of the cover member. The reactive heating layer further comprises a solder layer, which is located on an outer face, facing the first metal frame, of the reactive heating layer. Alternatively or in addition, it is possible for the solder layer to be applied to an outer face, facing the reactive heating layer, of the first metal frame. Furthermore, the reactive heating layer may also be applied to the first metal frame.

Within the bounds of manufacturing tolerances, the reactive heating layer displays the frame-like shape of the first metal frame. In other words, on bringing together the reactive heating layer and the first metal frame, the reactive heating layer completely covers all the outer faces, remote from the light-emitting diode component, of the first metal frame, within the bounds of manufacturing tolerances. Conversely, the first metal frame completely covers all the outer faces, remote from the cover member, of the reactive heating layer, within the bounds of manufacturing tolerances.

According to at least one embodiment of the method, the cover member is mounted on the side, comprising the first metal frame, of the light-emitting diode component. In this case, the first metal frame and the reactive heating layer are preferably in direct contact with one another.

According to at least one embodiment of the method, the reactive heating layer undergoes electrical ignition. In other words, a reaction barrier is bridged by supplying electrical energy to the reactive heating layer, wherein an exothermic chemical reaction in the reactive heating layer may lead locally to melting of the solder layer. In this way, the reactive heating layer and the first metal frame fuse into a frame member. The soldered joint between the first metal frame and the cover member then results in a hermetically sealed cavity. This method step may be carried under a vacuum or in an inert gas atmosphere. In other words, the optoelectronic semiconductor device is introduced into a reaction chamber in which a reduced pressure prevails or in which an inert gas is present.

According to at least one embodiment of the method, application of the cover member comprises the following method steps:

providing the cover member, applying a reactive heating layer, which is formed with a reactive material, to a bottom face of the cover member or to the first metal frame, wherein, within the bounds of manufacturing tolerances, the reactive heating layer displays the frame-like shape of the first metal frame, mounting the cover member on the side, comprising the first metal frame, of the light-emitting diode component, wherein the first metal frame and the reactive heating layer are in direct contact with one another, electrical ignition of the reactive heating layer, wherein an exothermic reaction leads to melting of the reactive heating layer and the reactive heating layer and the first metal frame fuse together into a frame member.

On ignition of the reactive heating layer, only local melting of the solder layer takes place. The rest of the component, in particular the cover member and the light-emitting diode component, are not heated appreciably. In particular, it is thereby unnecessary to heat the entire component in a furnace in order to melt the solder layer, the other components of the optoelectronic semiconductor device thereby advantageously being exposed to only slight thermal loading.

According to at least one embodiment of the method, the material of the cover member is applied using a PVD, a CVD or an ALD method to the conversion element and the first metal frame. The cover member may then be formed, for example, with borosilicate glass. In this alternative method, the cover member is thus not initially made available as a glass sheet, but rather is created for the first time by the PVD, the CVD or the ALD method on an outer face, remote from the light-emitting diode component, of the conversion element and of the first metal frame. The optoelectronic semiconductor device then does not comprise any reactive heating layer. For example, the cover member may be a thin-film encapsulation, which is applied using a PVD, a CVD or an ALD method. In particular, the cover member may comprise at least one ALD layer, which is produced using an ALD method. In other words, at least this layer of the cover member is formed using an ALD method. Such ALD layers are known, for example, from US published specifications US 2011/0049730 A1 and US 2012/0132953 A1, the disclosure content of which is hereby included by reference.

According to at least one embodiment of the method, the conversion element is applied to the bottom face of the cover member prior to melting of the reactive heating layer and of the first metal frame. To this end, first of all a second metal frame is applied to the bottom face of the cover member. Application of the second metal frame may proceed similarly to application of the first metal frame. The reactive material is then deposited either on the second metal frame or on the first metal frame. Then the conversion element is applied together with the cover member to the side, comprising the first metal frame, of the light-emitting diode component. This constitutes an alternative option for joining the conversion element to the cover member and the light-emitting diode component.

A light source is furthermore provided. The light source in particular comprises an optoelectronic semiconductor device described here, which may preferably be produced using a method described here. In other words, all the features disclosed for the method and for the optoelectronic semiconductor device are also disclosed for the light source and vice versa.

According to at least one embodiment of the light source, the latter comprises a multiplicity of optoelectronic semiconductor devices. Furthermore, the light source comprises a molding assembly. The molding assembly comprises the respective moldings of the optoelectronic semiconductor devices, wherein the moldings are joined together laterally. In particular, the moldings may be joined together monolithically. In this case, the molding assembly is configured in one piece. The optoelectronic semiconductor devices are then joined laterally by means of the molding assembly.

According to at least one embodiment of the light source, a single cover member covers the multiplicity of optoelectronic semiconductor devices. In other words, not every optoelectronic semiconductor device comprises its own cover member, but rather a single, one-piece cover member covers all the optoelectronic semiconductor devices. In other words, the cover members of the respective optoelectronic semiconductor devices are joined together monolithically. The frame member is then arranged between adjacent conversion elements of the optoelectronic semiconductor devices. The frame member is thus arranged in the form of a grid around the conversion elements when viewed in plan view from the emission direction, wherein the conversion elements are each arranged in the grid mesh.

A method for producing a light source is furthermore provided. The light source may preferably be produced using this method. In other words, all the features disclosed for the method are also disclosed for the light source and vice versa.

According to at least one embodiment of the method for producing a light source, the molding assembly and the single cover member are singulated along part of the frame member or, within the bounds of manufacturing tolerances, parallel to at least part of the frame member. In this case, singulation of the frame member preferably likewise takes place.

As a result of this procedure, a light source, which has a first number of optoelectronic semiconductor devices, may be singulated into multiple light sources, which each have a smaller number than the first number of optoelectronic semiconductor devices. Preferably, singulation of the molding assembly and of the cover member proceeds along the entire frame member. In this case, through singulation, a multiplicity of optoelectronic semiconductor devices, which preferably correspond to precisely the first number of optoelectronic semiconductor devices, is made available. In other words, by singulating the cover member and the molding assembly along the frame member, individual optoelectronic semiconductor devices may be produced from one light source comprising a first number of optoelectronic semiconductor devices.

BRIEF DESCRIPTION OF THE DRAWINGS

The optoelectronic semiconductor device described here, the method described here and the light source described here are explained in greater detail below with reference to exemplary embodiments and the associated figures.

FIGS. 1, 2A, 2B, 3A and 3B show exemplary embodiments of a method described here and an optoelectronic semiconductor device described here, in the form of schematic sectional representations.

FIGS. 4, 5 and 6 show exemplary embodiments of an optoelectronic semiconductor device described here, in the form of schematic sectional representations.

Figure 1:
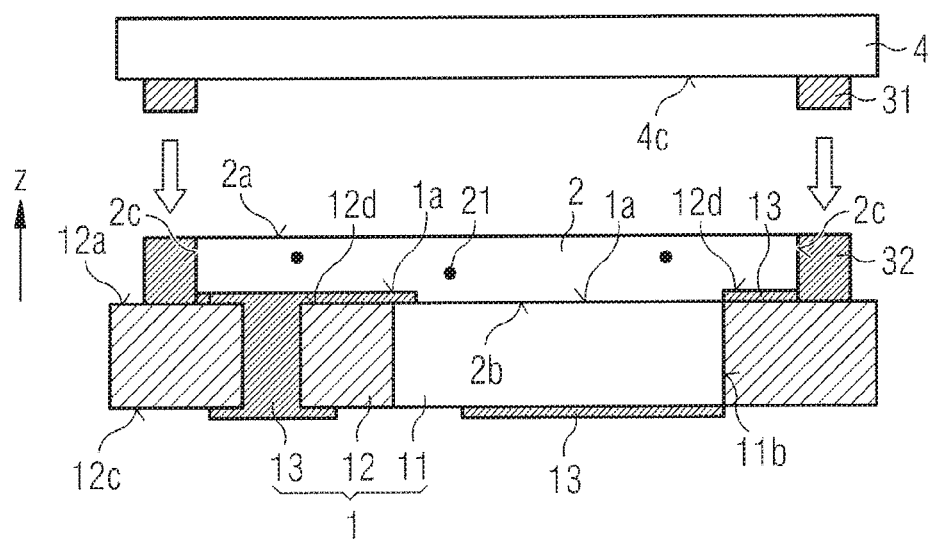

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

On the basis of the schematic sectional representation of FIG. 1, a method step of a method described here for producing an optoelectronic semiconductor device 9 is explained in greater detail. In the method, first of all a light-emitting diode component 1 having at least one light-emitting diode chip 11 and a top face 1a is provided. The top face 1a is arranged downstream of the light-emitting diode component 1 in an emission direction Z.

The light-emitting diode component 1 further comprises a molding 12 and connection points 13. The molding 12 here encloses the light-emitting diode chip 11 at the lateral side faces 11b thereof. The connection points 13 pass right through the molding 12 and extend at least in part on a bottom face 12C and/or a top face 12a of the molding 12. It is however—other than is shown in the figures—also possible for the connection points to be mounted on a laterally located side face of the molding 12 and for the molding 12 to completely cover a bottom face, remote from the top face, of the light-emitting diode chip 11 and of the connection points 13.

A conversion element 2 comprising wave-converting quantum dots 21 is arranged on the light-emitting diode component 1. It is however also possible to use another sensitive, narrowband-converting converter material, such as, for example, a sulfide or a thiogallate. In addition, the conversion element 2 may comprise a top face 2a remote from the light-emitting diode component 1, a bottom face 2b facing the light-emitting diode component 1 and side faces 2c. The conversion element 2 is arranged downstream of the light-emitting diode chip 11 in the emission direction Z. All of the outer faces of the molding 12 facing the conversion element 2 may here be covered by the connection points 13, within the bounds of manufacturing tolerances. The conversion element 2 is therefore not in direct contact with the molding 12. Only exposed outer faces of the light-emitting diode chip 11 can come into direct contact with the conversion element 2.

In the present exemplary embodiment, the connection points 13 completely cover the outer faces 12d, facing the conversion element 2, of the molding 12, within the bounds of manufacturing tolerances. In FIG. 2, the outer faces 12d, facing the conversion element 2, of the molding 12 comprise parts of the top face 12a of the molding 12. The connection points 13 additionally cover the light-emitting diode chip 11 at least in part in the emission direction Z. At these points, contacting of the light-emitting diode chip 11 with the connection points 13 is, for example, possible.

In the method step illustrated in FIG. 1, the conversion element 2 has already been enclosed in the manner of a frame by a first metal frame 32. The first metal frame 32 laterally delimits the conversion element 2. The first metal frame 32 may, for example, be formed with a metal.

In the method step illustrated here, a radiation-transmissive cover member 4 is applied to the already applied components, i.e. to the conversion element 2 and the first metal frame 32. The cover member 4 comprises a reactive heating layer 31 on its bottom face 4c. Within the bounds of manufacturing tolerances, the reactive heating layer 31 displays the frame-like shape of the first metal frame 32. In this way, a hermetic seal may be produced by joining the reactive heating layer 31 to the metal frame 32. The cover member 4, including the reactive heating layer 31, is applied to the first metal frame 32 and fused with same by electrical ignition.

A method for an optoelectronic semiconductor device 9 described here is explained in greater detail with reference to the schematic sectional representation of FIG. 2A. In this exemplary embodiment the connection points 13 cover the outer faces 12d, facing the conversion element 2, of the molding 12 only in places. Thus, the connection points 13 do not bring about hermetic sealing.

In the exemplary embodiment according to FIG. 2A, the device comprises a barrier layer 5, which is arranged between the light-emitting diode component 1 and the conversion element 2. The barrier layer 5 completely covers all the outer faces, facing the conversion element 2, of the light-emitting diode component 1. In particular, the barrier layer 5 covers all the outer faces 12d, facing the conversion element 2, of the molding 12. The barrier layer 5 directly adjoins the conversion element 2.

Furthermore, a contact point 14 of the light-emitting diode chip is shown in the exemplary embodiment described here, but not in the other figures. The contact point 14 serves in contacting of the light-emitting diode chip 11 by means of the connection points 13. To this end, the connection points 13 directly adjoin the contact point 14.

A method for an optoelectronic semiconductor device 9 described here is explained in greater detail with reference to the schematic sectional representation of FIG. 2B. In contrast to the exemplary embodiment of FIG. 2A, an additional adhesive layer 22 is arranged between the conversion element 2 and the barrier layer 5. The adhesive layer 22 is in direct contact with the light-emitting diode chip 11 and the conversion element 2. The adhesive layer 22 may, for example, be formed with silicone and/or a resin.

In the exemplary embodiment of FIG. 2B, the barrier layer 5 moreover covers only the outer faces 12d, facing the conversion element 2, of the molding 12. These include part of the top face 12a of the molding 12. The top face, facing the conversion element, of the light-emitting diode chip 11 remains free of the barrier layer 5 at least in places.

Figure 3A:
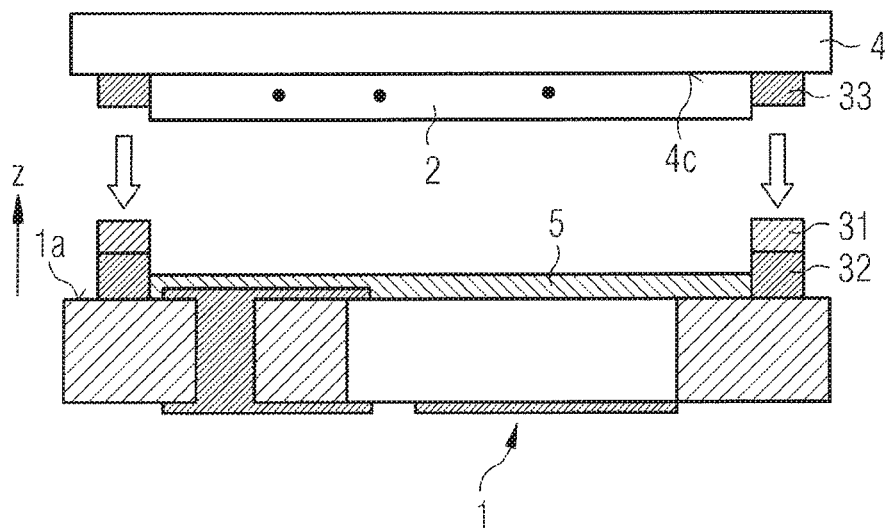

A further exemplary embodiment of a method described here for producing an optoelectronic semiconductor device 9 is explained in greater detail with reference to the schematic sectional representation of FIG. 3A. In the exemplary embodiment shown here, the conversion element 2 is applied to the bottom face 4c of the cover member 4. The reactive heating layer 31 is applied to the first metal frame 32, which is in turn applied to the top face 1a of the light-emitting diode component 1. A second metal frame 33, which laterally delimits the conversion element 2, is arranged on the bottom face 4c of the cover member 4. The conversion element is applied, together with the cover member 4, to the first metal frame 32 and the reactive heating layer 31. The first metal frame 32, the reactive heating layer 31 and the second metal frame 33 then together form a frame member 3, after assembly of the cover member with the other components.

Figure 3B:
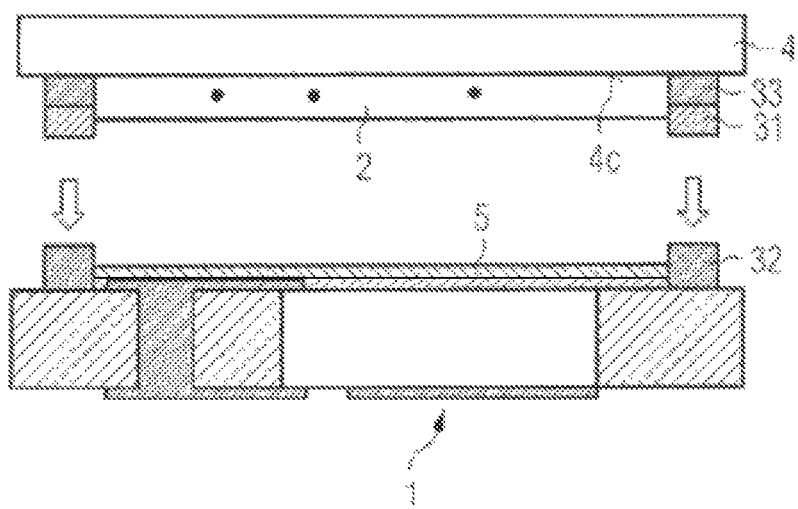

A further exemplary embodiment of a method described here for producing an optoelectronic semiconductor device 9 is explained in greater detail with reference to the schematic sectional representation of FIG. 3B. This exemplary embodiment differs from the exemplary embodiment of FIG. 3A in that the reactive heating layer 31 is in direct contact with the second metal frame 33. The reactive heating layer 31 is then applied together with the cover member 4 to the first metal frame 32.

In the exemplary embodiment according to FIG. 3, a barrier layer 5 is moreover present. The barrier layer 5 completely covers the top face 1a of the light-emitting diode component 1 and serves in hermetic sealing of the conversion element 2 relative to the molding 12.

A further exemplary embodiment of an optoelectronic semiconductor device 9 described here is explained in greater detail with reference to the schematic sectional representation of FIG. 4. The optoelectronic semiconductor device 9 is produced, for example, using the method according to FIG. 2A. Joining of the reactive heating layer 31 and the first metal frame 32 has resulted in formation of a frame member 3. The frame member 3 encloses the conversion element 2 in the manner of a frame. In particular, the frame member 3 encloses all the side faces 2c of the conversion element 2 in the manner of a frame. The cover member 4 covers all the outer faces, remote from the light-emitting diode chip 11, of the conversion element 2. In particular, the cover member 4 covers the conversion element 2 at its top face 2a remote from the light-emitting diode chip 11. An interspace 6 is arranged between the conversion element 2 and the cover member 4. The interspace 6 may, for example, be an air-filled empty space. It is furthermore possible for an inert gas to be introduced into the interspace 6. Furthermore, a vacuum, i.e. a reduced pressure, may also prevail in the interspace 6. The pressure in the interspace 6 preferably amounts to at most $10^{-5}$ mbar.

A further exemplary embodiment of an optoelectronic semiconductor device 9 described here is explained in greater detail with reference to the schematic sectional representation of FIG. 5. The exemplary embodiment shown here corresponds substantially to that of FIG. 4, with the difference that the cover member 4 has recesses 41 at a top face 4a remote from the light-emitting diode component, which recesses serve in improved radiation outcoupling of the electromagnetic radiation emitted by the light-emitting diode chip 11. The recesses 41 reduce the total reflection at the boundary surface between the material of the cover member 4 and the ambient air. Alternatively or in addition, the cover member 4 and/or the recesses 41 may be configured in the form of a lens. Furthermore, it is possible for the cover member 4 alternatively or additionally to comprise an anti-reflective layer at its top face 4a, which likewise ensures improved outcoupling of the electromagnetic radiation emitted by the light-emitting diode chip 11.

A further exemplary embodiment of an optoelectronic semiconductor device 9 described here is explained in greater detail with reference to the schematic sectional representation of FIG. 6. The cover member 4 of the optoelectronic semiconductor device 9 shown here has been deposited using a PVD method. This is visible from the uniform overmolding of the previously applied components. For example, in this way the shape of the frame member 3 may be transferred to the cover member 4, such that a radiation exit face 4a, remote from the bottom face, of the cover member 4 is at a greater distance from the light-emitting diode component 1 in the regions of the frame member 3.

When a PVD method is used, the advantage is achieved that the cover member seals the conversion element 2 directly relative to the exterior. In other words, no interspace 6 is present between the conversion element 2 and the cover member 4, so ensuring better stability of the matrix material of the conversion element 2. In particular, it is thus ensured that any air particles present in the interspace 6 cannot lead to oxidation of the protective layer of the quantum dots 21.

An exemplary embodiment of a light source described here is explained in greater detail with reference to the schematic sectional representation of FIG. 7. A light source comprises a multiplicity of optoelectronic semiconductor devices 9. In addition, the light source comprises a molding assembly 12', wherein the molding assembly comprises the moldings 12 of the optoelectronic semiconductor devices 9. The optoelectronic semiconductor devices 9 are here joined together laterally by means of the molding assembly 12'. A light source additionally comprises a single cover member 4', which simultaneously covers a multiplicity of optoelectronic semiconductor devices 9. The frame member 3 is arranged between adjacent conversion elements 2 of the optoelectronic semiconductor devices 9.

Figure 7:
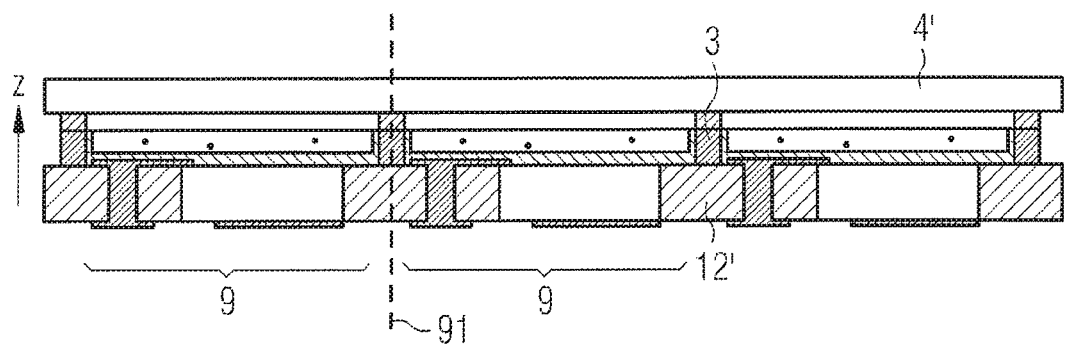
FIGS. 7 and 8 show exemplary embodiments of a light source described here, in the form of a schematic sectional representation and a schematic plan view.

The molding assembly 12' and the single cover member 4' may optionally be singulated along the broken line in FIG. 7. Singulation may proceed, for example, with a cutting tool and/or a laser. In addition, the molding assembly 12' and the single cover member 4' may be singulated along a line extending parallel to the broken line 91, within the bounds of manufacturing tolerances.

Figure 8:
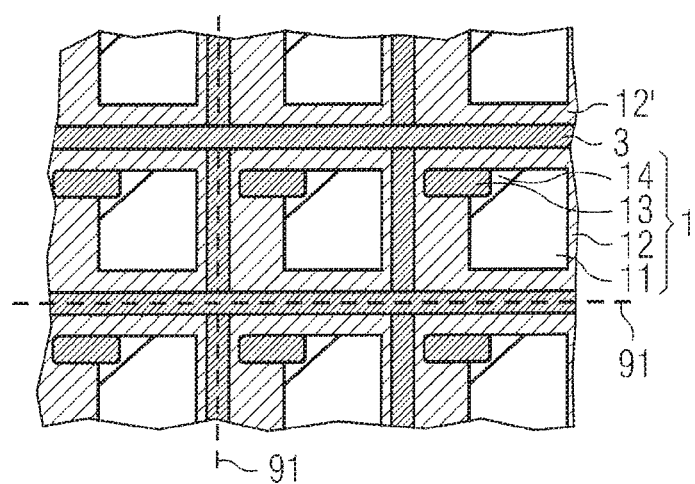

An exemplary embodiment of a light source described here is explained in greater detail with reference to the schematic plan view of FIG. 8. The plan view is here taken from the emission direction Z. Due to the radiation-transmissive embodiment of the joint cover member 4', the individual light-emitting diode components 9 with the respective light-emitting diode chips 11, the connection points 13 and the contact points 14 are visible in this plan view. The optoelectronic semiconductor devices 9 are separated laterally from one another by the frame member 3. In plan view, the frame member 3 accordingly takes the form of a grid. The molding assembly 12' joins the optoelectronic semiconductor devices 9 together. The molding assembly 12' and the single cover member 4' may optionally be singulated along the broken line 91.

A method described here and/or an optoelectronic semiconductor device 9 described here in particular bring about the advantage that a compact and favorably producible light-emitting diode component 1 with a molding 12 may be used in conjunction with a conversion element 2 with quantum dots 21. This may be achieved by hermetic sealing by means of the barrier layer 5, the frame member 3 and/or the cover member 4.

The combination of a compact light-emitting diode component with a conversion material with wavelength-converting quantum dots and a hermetic seal makes it possible to provide a compact, robust and inexpensively produced light source with a narrow-band emission spectrum.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor device comprising:
    a light-emitting diode component comprising:
        at least one light-emitting diode chip and a top face, the top face arranged downstream of the light-emitting diode chip in an emission direction;
        a molding enclosing side faces of the light-emitting diode chip, wherein the molding terminates flush with a top face of the light-emitting diode chip; and
        connection points;
    a conversion element arranged downstream of the light-emitting diode component in the emission direction, the conversion element comprising wavelength-converting quantum dots;
    a frame member enclosing all side faces of the conversion element in a frame-like manner, wherein the frame member comprises a reactive heating layer and a first metal frame, wherein the reactive heating layer comprises a reactive material comprising at least one metal, wherein the first metal frame comprises a metal, wherein the first metal frame is arranged on a top face of the molding, and wherein the first metal frame is in direct contact with the molding; and
    a cover member arranged downstream of the conversion element in the emission direction, the cover member comprising a radiation-transmissive material, wherein the cover member covers the conversion element at a top face remote from the light-emitting diode chip.

2. The optoelectronic semiconductor device according to claim 1, further comprising a barrier layer arranged between the light-emitting diode component and the conversion element, wherein the barrier layer completely covers all outer faces of the light-emitting diode component that face the conversion element.

3. The optoelectronic semiconductor device according to claim 1, wherein the cover member and the frame member are joined together and completely cover all outer faces of the conversion element that are remote from the light-emitting diode component.

4. The optoelectronic semiconductor device according to claim 1, further comprising a barrier layer arranged between the light-emitting diode component and the conversion element, wherein the barrier layer completely covers all outer faces of the molding that face the conversion element.

5. The optoelectronic semiconductor device according to claim 4, wherein the conversion element is hermetically sealed by the barrier layer and/or the connection points, the frame member and the cover member, within bounds of manufacturing tolerances.

6. The optoelectronic semiconductor device according to claim 4, wherein a material of the barrier layer, a material of the frame member and/or a material of the cover member has a water vapor transmission rate which amounts to at most $1 \times 10^{-3}$ g/m²/day.

7. The optoelectronic semiconductor device according to claim 6, wherein a material of the molding has a higher water vapor transmission rate than the material of the barrier layer.

8. The optoelectronic semiconductor device according to claim 4, wherein the barrier layer comprises at least one first layer and at least one second layer in the emission direction, and wherein the first layer comprises an organic material and the second layer comprises an inorganic material.

9. A light source comprising:
a plurality of optoelectronic semiconductor devices according to claim 1; and
a molding assembly,
wherein the molding assembly comprises the moldings of the optoelectronic semiconductor devices,
wherein the optoelectronic semiconductor devices are joined laterally by the molding assembly,
wherein the cover members form a single cover member covering the optoelectronic semiconductor devices, and
wherein adjacent conversion elements are located on different sides of adjacent frame members.

10. A method for manufacturing the light source according to the claim 9, the method comprising:
singulating the molding assembly and the single cover member along part of the adjacent frame members or, within bounds of manufacturing tolerances, parallel to at least part of the adjacent frame members.

* * * * *